United States Patent [19]
Ahrens et al.

[11] Patent Number: 5,286,992
[45] Date of Patent: Feb. 15, 1994

[54] LOW VOLTAGE DEVICE IN A HIGH VOLTAGE SUBSTRATE

[75] Inventors: Michael G. Ahrens, Sunnyvale; Douglas C. Galbraith, Fremont; Abdelshafy Eltoukhy, San Jose, all of Calif.

[73] Assignee: Actel Corporation, Sunnyvale, Calif.

[21] Appl. No.: 38,550

[22] Filed: Mar. 29, 1993

Related U.S. Application Data

[63] Continuation of Ser. No. 865,078, Apr. 8, 1992, abandoned, which is a continuation of Ser. No. 590,277, Sep. 28, 1990, abandoned.

[51] Int. Cl.$^5$ .................... H01L 29/68; H01L 29/78
[52] U.S. Cl. ........................... 257/356; 257/409; 257/901
[58] Field of Search ............ 257/356, 409, 355, 357, 257/360, 901

[56] References Cited

U.S. PATENT DOCUMENTS

| | | | |
|---|---|---|---|
| 4,822,750 | 4/1989 | Perlegos et al. | 357/23.5 |
| 4,829,350 | 5/1989 | Miller | 257/357 |
| 4,851,364 | 7/1989 | Yatsuda et al. | 357/23.5 |
| 4,878,199 | 10/1989 | Mizutani | 357/41 |
| 4,937,471 | 6/1990 | Park et al. | 257/357 |

OTHER PUBLICATIONS

Sze, S. M. *Physics of Semiconductor Devices*, John Wiley, 1981, pp. 438–445.

Primary Examiner—Sara W. Crane
Attorney, Agent, or Firm—D'Alessandro, Frazzini & Ritchie

[57] ABSTRACT

A semiconductor or substrate of a first conductivity type includes a well structure of a second conductivity type formed therein. A first low voltage MOS transistor includes spaced apart source and drain regions of the first conductivity type in the well. A first transistor gate lies above a channel region which is disposed between the source and drain regions of the first low voltage MOS transistor and is separated therefrom by a gate dielectric having a first thickness. A second high voltage transistor includes spaced apart source and drain regions of the first conductivity type in the well. A second transistor gate lies above a channel region which is disposed between the source and drain regions of the second high voltage transistor and is separated therefrom by a gate dielectric having a second thickness which is greater than the thickness of the gate dielectric of the first low voltage MOS transistor. A first contact diffusion, having the same conductivity type as the well, is located at the edge of the well closest to the first low voltage transistor, and is connected to a source of voltage. A second contact diffusion, having the same conductivity type as the well, is located at the edge of the well closest to the second high voltage transistor, and is also connected to the source of voltage.

3 Claims, 1 Drawing Sheet

LOW VOLTAGE DEVICE IN A HIGH VOLTAGE SUBSTRATE

RELATED APPLICATIONS

This application is a file-wrapper continuation of parent application Ser. No. 07/865,078, filed Apr. 8, 1992, now abandoned which is in turn a continuation of application Ser. No. 07/590,277, filed Sep. 28, 1990, now abandoned.

BACKGROUND OF THE INVENTION

1. Field Of The Invention

The present invention relates to integrated circuit technology and integrated circuit fabrication techniques. More particularly, the present invention relates to incorporation of a low voltage MOS device in a high voltage substrate or well.

2. The Prior Art

The design of MOSFET and MESFET circuits sometimes requires the inclusion of both low voltage and high voltage circuits on the same chip. Inclusion of both types of circuits is sometimes needed for aspects of the operation of a single chip, such as low voltage circuits for reading a PROM and high voltage circuits for programming the PROM. The design of MOSFET or MESFET circuits which include an interface between low voltage circuits and high voltage circuits traditionally incorporates two separate wells, one well for low voltage devices and a second well for high voltage devices. These separate wells are usually surrounded by double guard rings to suppress destructive latch up. The double wells and their attendant guard rings constitute a considerable layout area penalty, especially for repetitive circuits such as address or decoder level shifters.

As integrated circuit technology matures, and as circuit and layout designers strive to increase the density of integrated circuits, the provision of separate wells and their attendant guard rings for high and low voltage devices creates a limitation on achievable circuit density on an integrated circuit chip.

BRIEF DESCRIPTION OF THE INVENTION

According to a first aspect of the present invention, a semiconductor substrate of a first conductivity type includes a well structure of a second conductivity type formed therein. A first low voltage MOS transistor includes spaced apart source and drain regions of the first conductivity type in the well. A first transistor gate lies above a channel region which is disposed between the source and drain regions of the first low voltage MOS transistor and is separated therefrom by a gate dielectric having a first thickness.

A second high voltage transistor includes spaced apart source and drain regions of the first conductivity type in the well. A second transistor gate lies above a channel region which is disposed between the source and drain regions of the second high voltage transistor and is separated therefrom by a gate dielectric having a second thickness which is greater than the thickness of the gate dielectric of the first low voltage MOS transistor.

A first contact diffusion, having the same conductivity type as the well, is located at the edge of the well closest to the first low voltage transistor, and is connected to a source of voltage. A second contact diffusion, having the same conductivity type as the well, is located at the edge of the well closest to the second high voltage transistor, and is also connected to the source of voltage.

DETAILED DESCRIPTION OF A PREFERRED EMBODIMENT

Figure 1:
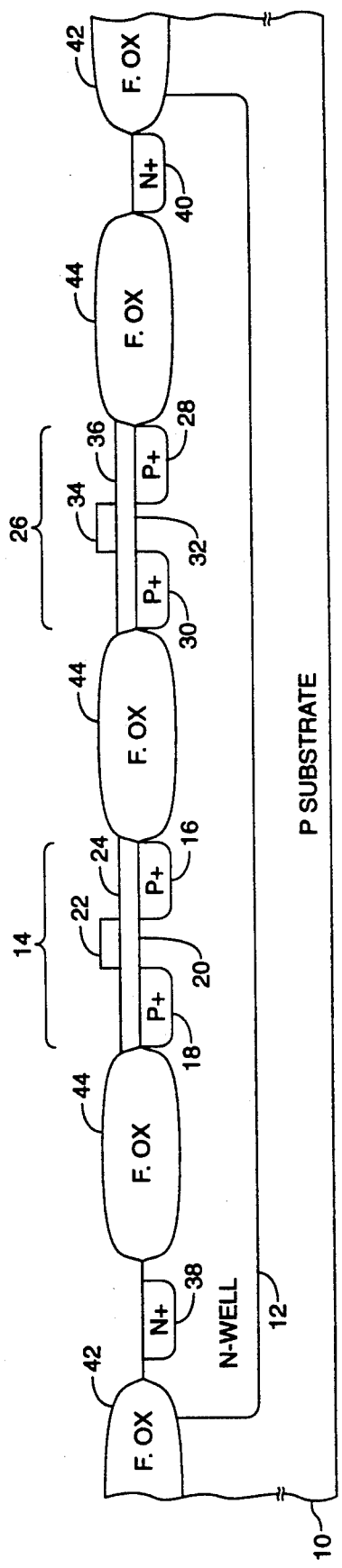
FIG. 1 is a cross sectional view of a semiconductor structure according to a presently preferred embodiment of the invention.

Referring first to FIG. 1, a semiconductor substrate 10 of a first conductivity type is shown to contain a well 12 of a second conductivity type. For purposes of discussing FIG. 1, the substrate 10 will be assumed to be a p-type substrate and the well 12 will be assumed to be an n-well, although those of ordinary skill in the art will readily recognize that the present invention could also be realized in an embodiment where a p-well is disposed within an n-type substrate.

A first, low voltage, MOS transistor 14 includes spaced apart source region 16 and drain region 18 disposed in well 12, serving to establish a channel 20 therebetween. Source region 16 and drain region 18 may be formed by well known methods. In a presently preferred embodiment, they are formed simultaneously by ion implantation of boron using a dose of about $5 \times 10^{15}$ atoms/cm$^3$ and an energy of about 30–50 KeV.

A first transistor gate 22 lies above channel 20 between source 16, and drain 18, and is separated therefrom by a first gate dielectric 24. As is well understood by those of ordinary skill in the art, first transistor gate 22 may be a polysilicon gate, formed using conventional technology. In a presently preferred embodiment, first transistor gate 22 is polysilicon doped with phosphorus to a sheet resistance of about 25–35 $\Omega/\square$.

First gate dielectric 24 may be a layer of thermally grown silicon dioxide as is well understood in the art. The thickness of first gate dielectric 24 will depend on the voltage which first, low voltage, MOS transistor 14 is expected to withstand. In the example to be discussed herein, first, low voltage, MOS transistor 14 is designed to withstand about 10 volts, and first gate dielectric should therefore be about 200–500 Å thick.

A second, high voltage, MOS transistor 26 includes spaced apart source region 28 and drain region 30 disposed in well 12, serving to establish a channel 32 therebetween. Source region 28 and drain region 30 may be formed by well known methods. In a presently preferred embodiment, they are formed simultaneously by ion implantation of boron using a dose of about $5 \times 10^{15}$ atoms/cm$^3$ and an energy of about 30–50 KeV.

A second transistor gate 34 lies above channel 32 between source 28, and drain 30, and is separated therefrom by a second gate dielectric 36. As is well understood by those of ordinary skill in the art, second transistor gate 34 may be a polysilicon gate, formed using conventional technology. In a presently preferred embodiment, second transistor gate 34 is polysilicon doped with phosphorus to a sheet resistance of about 25–35 $\Omega/\square$.

Like first gate dielectric 24, second gate dielectric 36 may be a layer of thermally grown silicon dioxide as is well understood in the art. The thickness of second gate dielectric 36 will depend on the voltage which second, high voltage, MOS transistor 26 is expected to withstand. In the example to be discussed herein, second, high voltage, MOS transistor 26 is designed to withstand about 18 volts, and second gate dielectric 36 should therefore be about 400 Å thick. This is a greater thickness than first gate dielectric 24 and, as appreciated by those of ordinary skill in the art, provides a higher breakdown voltage characteristic for high voltage transistor 26.

First and second well contacts 38 and 40, having a conductivity type the same as the conductivity type of well 12, are formed in well 12 close to opposite ones of its edges using known semiconductor fabrication techniques.

Field oxide regions 42 surround the periphery of well 12, and field oxide regions 44 separate the various structures within well 12 as is customary in the semiconductor art.

During normal circuit operation, the gate-to-source voltage of first, low voltage, MOS transistor 14 will normally swing between 0–5 volts, and the gate-to-source voltage of second, high voltage, MOS transistor 26 will normally swing between about 0–22 volts.

Figure 2:
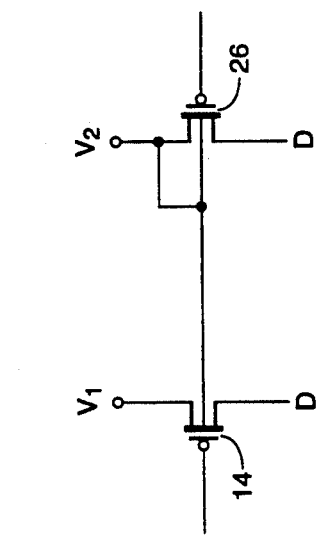
FIG. 2 is an equivalent schematic diagram of the structure depicted in FIG. 1.

Referring now to FIG. 2, the equivalent schematic diagram of the structure of FIG. 1 shows first, low voltage, MOS transistor 14 having its gate connected to a source of gate voltage $V_{g1}$. The gate voltage $V_{g1}$ may swing between $V_0$, a negative voltage source, and a positive voltage limited by the breakdown of the transistor. The source of transistor 14 is connected to positive voltage source $V_1$. The drain of first, low voltage, MOS transistor 14 may be connected to other circuitry (not shown).

Second, high voltage, MOS transistor 26 has its gate connected to a source of gate voltage $V_{g2}$. The gate voltage $V_{g2}$ may swing between $V_0$ and a positive voltage limited by the breakdown of the transistor. The source of high voltage transistor 26 is connected to positive voltage source $V_2$, which is higher than $V_1$ and may be higher than the breakdown voltage of transistor 14. The drain of second, high voltage, MOS transistor 26 may be connected to other circuitry (not shown). The substrates of both transistors 14 and 26 (i.e., the well 12) are connected to voltage source $V_2$.

In a typical application, $V_1$ will be 5 volts, used for powering logic, and $V_2$ will be 20 volts, used for programming purposes on the semiconductor chip. If conventional MOS device and circuit design techniques are employed, the thickness of first gate dielectric 24 will usually be such that it cannot withstand a gate to source voltage of 20 volts. This would normally require that first, low voltage, MOS transistor 14 be fabricated in a separate well in order to protect its gate dielectric from damage.

By using the present invention, however, the thin gate dielectric 24 of first, low voltage, MOS transistor 14 is protected from the electric field of the well-to-gate potential difference by a depletion layer which is formed at the surface of the well 12. The surface potential at the gate region of first, low voltage, MOS transistor 14 is established at $V_1$ because its source 16 is connected to voltage source $V_1$. The depletion layer will drop most of the potential difference between the bulk of the well and the gate of first, low voltage, MOS transistor 14, limiting the voltage across the gate dielectric to approximately the gate-to-source voltage.

Figure 3:
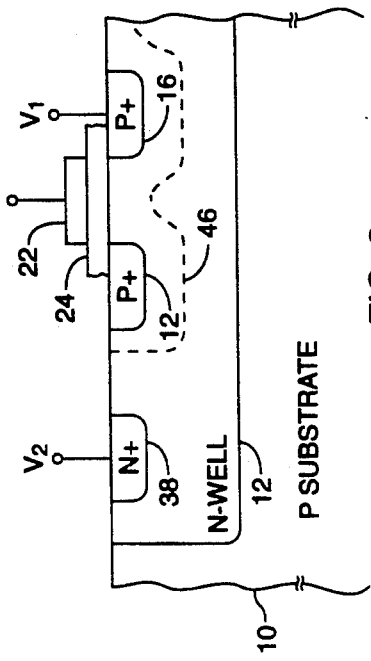
FIG. 3 is an enlarged cross sectional view of a portion of the semiconductor structure of FIG. 1, showing the operation of the invention.

The operation of the present invention may be most easily seen with reference to FIG. 3, an enlarged portion of the cross section of FIG. 1 showing first, low voltage, MOS transistor 14 in more detail. It can be easily seen that the surface potential at the gate region of first, low voltage, MOS transistor 14 is established at $V_1$ because its source 16 is connected to voltage source $V_1$. Any excess holes entering the channel raise the potential difference between the channel and the source. This potential difference creates an electric field which draws holes out of the channel and into the source, thereby reducing the channel potential. The excess holes are attracted to negative potential. For example, if the gate is at zero volts, the source is at 5 volts, the well is at 20 volts, and the drain is at zero volts, the excess holes will be swept into the drain because the channel drain is at zero volts while the source is 5 volts. Having the source at 5 volts means that the surface potential cannot exceed 5 volts, but it can be less than 5 volts if the drain is below 5 volts. The source voltage (combined with the gate voltage) puts a worst-case limit on the low voltage oxide stress potential which is within operating limits. Depletion layer 46 will drop most of the potential difference between the bulk of the well and the gate of first, low voltage, MOS transistor 14, limiting the voltage across the gate dielectric to approximately its gate-to-source voltage.

While a presently-preferred embodiment of the invention has been disclosed, those of ordinary skill in the art will, from an examination of the within disclosure and drawings be able to configure other embodiments of the invention. These other embodiments are intended to fall within the scope of the present invention which is to be limited only by the scope of the appended claims.

What is claimed is:

1. A semiconductor structure including:

a semiconductor substrate of a first conductivity type;

a well structure of a second conductivity type formed in said substrate;

a first MOS transistor in said well including spaced-apart first transistor source and drain regions of said first conductivity type in said well forming a first transistor channel region therebetween, a first transistor gate disposed above said first transistor channel region and separated therefrom by a first transistor gate dielectric having a first thickness, such that said first transistor can safely operate at a first gate-to-source voltage;

a second transistor in said well including spaced-apart second source and drain regions of said first conductivity type in said well forming a second transistor channel therebetween, a second transistor gate disposed above said second transistor channel region and separated therefrom by a second transistor gate dielectric having a second thickness which is greater than the thickness of said first transistor gate dielectric, such that said second transistor can operate at a second gate-to-source voltage, said second gate-to-source voltage having a magnitude sufficient to destroy said first transistor;

a first contact diffusion of said second conductivity type located at the edge of said well closest to said first transistor, connected to a voltage source having a magnitude selected to form a depletion layer at the surface of said well sufficient to limit the voltage across said first transistor gate dielectric to approximately the gate-to-source voltage of said first transistor;

a second contact diffusion of said second conductivity type located at the edge of said well closest to said second transistor, connected to said voltage source; and said well maintained at a voltage potential equal to at least the voltage potential of any of said first and second source and drain regions in said well.

2. A semiconductor structure including:

a semiconductor substrate of a first conductivity type;

a well structure of a second conductivity type formed in said substrate;

a first MOS transistor in said well including spaced-apart first transistor source and drain regions of said first conductivity type in said well forming a first transistor channel region therebetween, a first transistor gate disposed above said first transistor channel region and separated therefrom by a first transistor gate dielectric having a first thickness, such that said first transistor can safely operate at a first gate-to-source voltage;

a second transistor in said well including spaced-apart second source and drain regions of said first conductivity type in said well forming a second transistor channel therebetween, a second transistor gate disposed above said second transistor channel region and separated therefrom by a second transistor gate dielectric having a second thickness which is greater than the thickness of said first transistor gate dielectric, such that said second transistor can operate at a second gate-to-source voltage, said second gate-to-source voltage having a magnitude sufficient to destroy said first transistor;

means for biasing said well structure at a voltage having a magnitude selected to form a depletion layer at the surface of said well sufficient to limit the voltage across said first transistor gate dielectric to approximately the gate-to-source voltage of said first transistor; and said well maintained at a voltage potential equal to at least the voltage potential of any of said first and second source and drain regions in said well.

3. The semiconductor structure of claim 2 wherein said means for biasing said well structure includes at least a first contact diffusion of said second conductivity type located at the edge of said well closest to said first transistor, connected to a voltage source having a magnitude selected to form a depletion layer at the surface of said well sufficient to limit the voltage across said first transistor gate dielectric to approximately the gate-to-source voltage of said first transistor.

* * * * *

UNITED STATES PATENT AND TRADEMARK OFFICE
CERTIFICATE OF CORRECTION

PATENT NO. : 5,286,992

DATED : February 15, 1994

INVENTOR(S) : Michael G. Ahrens, Douglas C. Galbraith, Abdelshafy Eltoukhy

It is certified that error appears in the above-identified patent and that said Letters Patent is hereby corrected as shown below:

Title page, item [57],

In the Abstract

On line 1, delete "or".

Signed and Sealed this

Twenty-eighth Day of June, 1994

*Attest:*

BRUCE LEHMAN

*Attesting Officer*     *Commissioner of Patents and Trademarks*